United States Patent
Almog et al.

(10) Patent No.: US 8,918,678 B2
(45) Date of Patent: Dec. 23, 2014

(54) FUNCTIONAL TESTING OF A PROCESSOR DESIGN

(71) Applicant: International Business Machines Corporation, Armonk, NY (US)

(72) Inventors: Eli Almog, Poughkeepsie, NY (US); Olaf K. Hendrickson, Rochester, MN (US); Christopher A. Krygowski, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/103,988

(22) Filed: Dec. 12, 2013

(65) Prior Publication Data
US 2014/0101628 A1    Apr. 10, 2014

Related U.S. Application Data

(63) Continuation of application No. 13/355,004, filed on Jan. 20, 2012.

(51) Int. Cl.
*G06F 11/263*  (2006.01)
*G06F 11/22*  (2006.01)
*G06F 17/50*  (2006.01)

(52) U.S. Cl.
CPC ........ *G06F 17/5045* (2013.01); *G06F 11/2236* (2013.01)
USPC ............................... 714/37; 714/738; 703/21

(58) Field of Classification Search
CPC ............................ G06F 11/2236; G06F 11/263
USPC ...................... 714/37, 738; 703/21
See application file for complete search history.

(56) References Cited

U.S. PATENT DOCUMENTS

| 4,520,440 A | 5/1985 | Buonomo et al. |
|---|---|---|
| 5,592,674 A | 1/1997 | Gluska et al. |
| 6,175,946 B1 | 1/2001 | Ly et al. |

(Continued)

FOREIGN PATENT DOCUMENTS

| EP | 0628911 A3 | 12/1994 |
|---|---|---|
| EP | 0721166 A1 | 1/1995 |
| WO | WO2004017232 A2 | 2/2004 |

OTHER PUBLICATIONS

"Computer Architecture Modeling, Synthesis, and Verification"; Arvind, Daniel L et al.; MIT Laboratories for Computer Science; Mar. 2003 pp. 205-206.

(Continued)

*Primary Examiner* — Chae Ko
(74) *Attorney, Agent, or Firm* — Cantor Colburn LLP; Margaret McNamara (57) ABSTRACT

According to exemplary embodiments, a computer implemented method for functional testing of a processor design includes accessing a test template from a library of test templates, wherein the test template is configured to test a first selected function of the processor and inputting the test template to an automated test generation tool executed by a computer. The method further includes generating an instruction sequence based on the test template by the automated test generation tool and injecting an event instruction to the instruction sequence during the generating of the instruction sequence by the automated test generation tool, the injecting of the event instruction preserving testing of the first selected function of the processor and the event instruction being configured to test a second selected function of the processor. The method includes verifying a function of the processor by analyzing responses of the processor to the instruction sequence.

20 Claims, 4 Drawing Sheets

(56) References Cited

U.S. PATENT DOCUMENTS

| | | |
|---|---|---|
| 6,285,974 B1 | 9/2001 | Mandyam et al. |
| 6,564,178 B1 | 5/2003 | Brummel |
| 6,609,229 B1 | 8/2003 | Ly et al. |
| 7,389,215 B2 | 6/2008 | Azatchi et al. |
| 7,627,843 B2 | 12/2009 | Dozorets et al. |
| 7,676,777 B2 | 3/2010 | Kowatari et al. |
| 8,006,204 B2 | 8/2011 | Killian et al. |
| 2003/0191985 A1 | 10/2003 | Barrett |
| 2005/0125468 A1 | 6/2005 | Enenkel |
| 2006/0212756 A1 | 9/2006 | Emek et al. |
| 2006/0259878 A1 | 11/2006 | Killian et al. |
| 2007/0234249 A1 | 10/2007 | Kowatari et al. |
| 2009/0222694 A1 | 9/2009 | Adir et al. |
| 2009/0313590 A1 | 12/2009 | Emek et al. |

OTHER PUBLICATIONS

U.S. Appl. No. 13/355,004; Notice of Allowance; filed Jan. 20, 2012; Date Mailed: Jan. 27, 2014; pp. 1-14.

FUNCTIONAL TESTING OF A PROCESSOR DESIGN

CROSS-REFERENCE TO RELATED APPLICATION

This application is a continuation of U.S. patent application Ser. No. 13/355,004, filed Jan. 20, 2012, the content of which is incorporated by reference herein in its entirety.

BACKGROUND

The present invention relates to testing of integrated circuits, and more specifically, to pre-silicon functional testing of processors.

Pre-silicon functional testing of a processor, such as a microprocessor, may be accomplished by supplying test templates from a library into an automated testcase generation tool which produces assembly level instruction sequences from the templates. These templates may include certain mandatory functions configured to exercise certain architectural and microarchitectural functions within the microprocessor.

The libraries of templates are established where each template in the library is targeted to testing one or more selected characteristic or feature of the processor via simulation. When a new feature or attribute is added to the processor, it is desirable for a test engineer to test the new feature in addition to the existing tests performed by the established templates in the library. Manually adding the capability for testing a selected feature or characteristic to each template in a library would be inefficient and time consuming.

SUMMARY

According to exemplary embodiments, a computer program product for functional testing of a processor design is provided that includes a tangible storage medium readable by a processing circuit and storing instructions for execution by the processing circuit for performing a method. The method performed includes accessing a test template from a library of test templates, wherein the test template is configured to test a first selected function of the processor and inputting the test template to an automated test generation tool executed by a computer. The method further includes generating an instruction sequence based on the test template by the automated test generation tool and injecting an event instruction to the instruction sequence during the generating of the instruction sequence by the automated test generation tool, the injecting of the event instruction preserving testing of the first selected function of the processor and the event instruction being configured to test a second selected function of the processor. The method also includes verifying a function of the processor by analyzing responses of the processor to the instruction sequence.

According to further exemplary embodiments, a computer implemented method for functional testing of a processor design includes accessing a test template from a library of test templates, wherein the test template is configured to test a first selected function of the processor and inputting the test template to an automated test generation tool executed by a computer. The method further includes generating an instruction sequence based on the test template by the automated test generation tool and injecting an event instruction to the instruction sequence during the generating of the instruction sequence by the automated test generation tool, the injecting of the event instruction preserving testing of the first selected function of the processor and the event instruction being configured to test a second selected function of the processor. The method also includes verifying a function of the processor by analyzing responses of the processor to the instruction sequence.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments provide a method and system for pre-silicon functional verification testing of processors. An existing library of test templates may be used by a test case generator to generate an instruction sequence to test a set of selected mandatory processor functions or properties. The library may include a thousand or more test templates that are established and static (i.e., cannot be easily modified) templates configured to test the selected mandatory functions. Embodiments described herein provide a method and system to add testing functionality and flexibility to instruction sequences generated from the library of fixed or static test templates. The newly tested function is added to the functions that are specified by the test templates as mandatory functions to be tested by the sequence. In an embodiment, a test engineer creates an event instruction that is configured to enhance testing of a selected function or feature of the processor. A control module and test case generator inject the event instruction into the instruction sequence generated by the test case generator. The selected function tested by the event instruction may be a new feature or other property of the processor that is to be evaluated prior to manufacturing the processor. The event instruction is injected into the instruction sequence while preserving testing of a mandatory set of functions or features, as specified by the test template.

In an embodiment, while writing a test template, an engineer often specifies the mandatory requirements, often corresponding to features or characteristics, which are to be preserved by the test case generator tool. However, it may be a best practice to allow many of the details to be non-mandatory allowing both randomization and architectural feasibility by the test case generator tool. For example, to generate a test instruction sequence that includes a scenario of Load-Hits-Store, a test template specifies that any Store instruction is to be followed by any Load instruction, with selected number of allowed filler instructions in between. It is left to the generator to select the filler instructions as well the architectural resources used by the Load and Store instructions (e.g., registers, storage addresses, control registers, translation resources, etc). Most often, the choices for filler instructions are not completely random but are a function of current architectural state (e.g., translation is on/off, exceptions filtering on/off, addressing mode, etc) when the choice is made. Therefore, the randomness of these states may be highly subject to the nature of the template as well as the limited legal choices which can be made by the generator. In an embodiment, a method and system are provided for adding functional testing capabilities to existing templates by injecting selected event instructions as the "filler instructions" within the test case generator tool.

Figure 1:
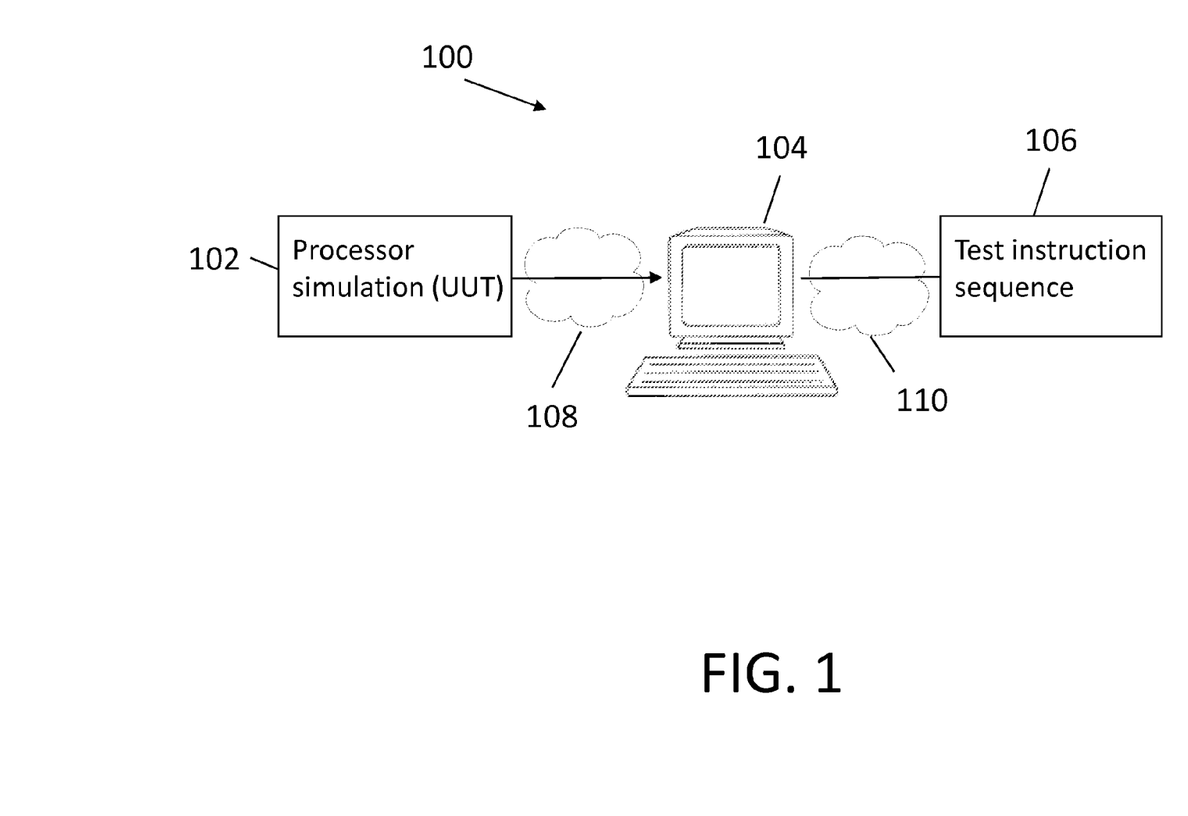
FIG. 1 illustrates a diagram of a test system according to an embodiment of the present invention.

With reference now to FIG. 1, an exemplary test system 100 upon which the pre-silicon functional testing of a processor design may be implemented is shown. The test system 100 includes a processor simulation 102 (also referred to as "design" or "model"), a host system 104 and a test instruction sequence 106 in communication with one another via a suitable arrangement or method, such as circuits, buses, and/or networks 108 and 110. The host system 104 may be a computer system with suitable hardware and software for performing the functions described herein. For example, the host system 104 may include a processor and memory that host a processor design and simulation software program, such as VHDL, where the processor design being tested ("unit under test" or "UUT") is a simulation performed by the program. Features and specifications of the processor design may be tested by a test routine or test sequence that is performed on the simulated processor. The test sequence may be generated by the method described herein, wherein a test template specifies selected features or mandatory functions to be tested. Accordingly, the design is tested and verified before manufacturing takes place to save costs and shorten product development time.

Figure 2:
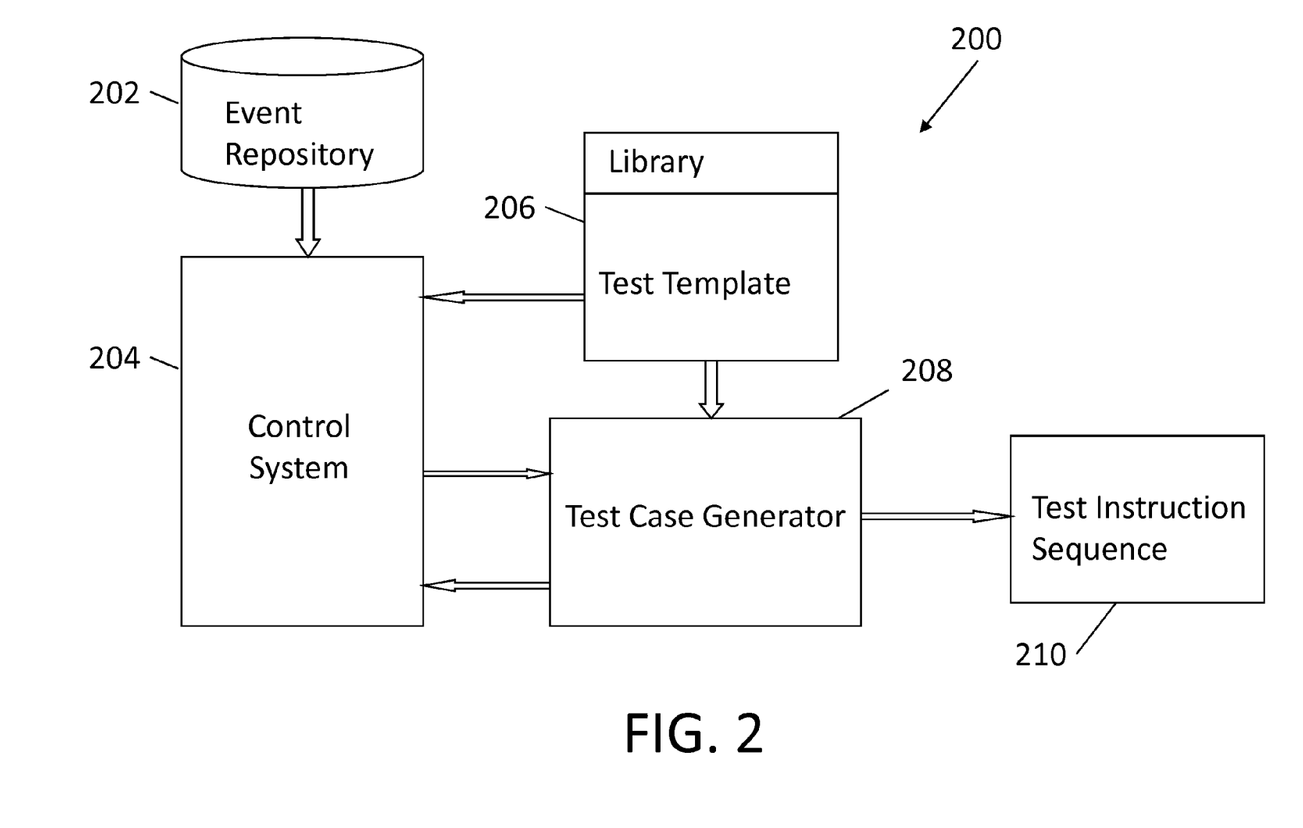
FIG. 2 illustrates a block diagram of a system for generating test instruction sequences to verify integrated circuit designs in accordance with an embodiment of the present invention.

FIG. 2 is a block diagram of an exemplary system 200 for generating test instruction sequences to verify integrated circuit designs, such as microprocessor designs. An event repository 202 is a library or set of event instructions (also referred to as "events") that are composed by a verification engineer. The event repository 202 is in communication with a control system 204 that accesses test templates from a library of test templates 206. The control system 204 and/or test case generator 208 access the library of test templates 206 and event repository 202 to produce a test instruction sequence 210. In an embodiment, the test case generator 208 generates additional information, such as a test case for a UUT that contains inputs, including the instructions (also called "stimulus"), intermediate test results that check for each instruction executed, and final results that are checked or verified The event repository 202 may include event instructions configured to achieve a plurality of functions and verify selected characteristics. For example one set of event instructions is configured to enable test templates (or test scenarios) to have an improved ability to generate testcases. In an embodiment, when all the general purpose registers have been allocated then a register reloading event instruction could be injected to allow the generator to move a value into a register for the formation of the Load or Store address. In another embodiment, a set of event instructions are meant to richen test templates with certain micro-architecturally interesting events. These events can be a function of the current state of the integrated circuit design under test. The event instructions of the event repository 202 may be grouped and organized in any suitable fashion. For example, event instructions which may significantly create disruptiveness to a microprocessor's pipeline could be identified such that they are prevented from being injected to selected test sequences by the control system 204. In an embodiment, the control system 204 is implemented via control statements within the test templates themselves. These control statements may define portions of the test templates where the test instruction sequence can be modified by events and block where the instruction sequence cannot be changed. In addition, the control statements of the control system 204 can have a granularity or a threshold as to which event instructions are allowed or prevented in selected test template blocks based upon selected groupings, characteristics or categories. Such characteristics include but are not limited to disruptiveness, nature of the event, resource consumption, and those as described above. Control statements may also be directed to preserving mandatory testing requirements for a test template, which may involve restricting performance or injection of selected event instructions. Further, control statements may restrict injection of the event instruction into portions of the sequence or the entire sequence. The control statements may specify that certain event instructions are incompatible with selected test templates. Specifically, selected test templates can have a control statement that prevents adding event instructions based on a selected characteristic, such as an event's disruptiveness or resource consumption. Thus, the event repository 202 may be organized by selected characteristics, where a control statement in the test template allows selection of the event instruction based on one or more of the selected characteristics. In another embodiment, the control system 204 and control statements may exist outside the test templates, such as within the events themselves.

Figure 3:
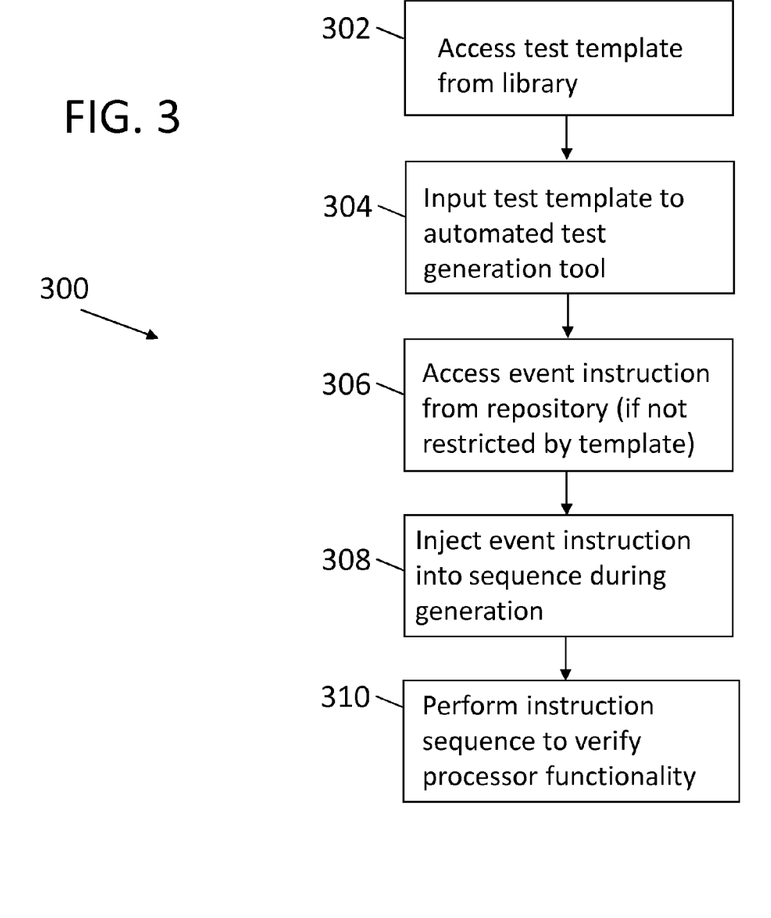
FIG. 3 illustrates diagram of a process performed by a computer for generating test instruction sequences to verify integrated circuit designs in accordance with an embodiment of the present invention.

FIG. 3 is a flow chart of an exemplary method 300 for generating a functional test instruction sequence for a simulated processor design. In block 302, a test template is accessed from a library of templates. The library may include a plurality of established and static test templates, where each template is configured to verify selected functions or characteristics of a unit under test (UUT). In an embodiment, the UUT is a model or simulated design of an integrated circuit, such as a microprocessor. In embodiments, a program running on a computer, such as host system 104 (FIG. 1) accesses the template from the library. Further, the blocks of the method 300 may be performed by any suitable system, such as the test system 100 shown in FIG. 1. In block 304, the test template is input into an automated test generation tool (e.g., test case generator 208), where the tool is configured to generate a test sequence based on the template. In block 306, an event instruction is accessed from the event repository, where the event instruction is configured to improve generation of test sequences or enhance test sequence coverage by injecting or adding selected interesting events to the sequence. Accordingly, in block 308, one or more event instruction accessed from the event repository is injected to the test instruction sequence by the automated test generation tool during generation of the test instruction sequence. The resulting test instruction sequence provides testing and verification of selected mandatory functions or features of the UUT (as required by the static test template) while also providing enhanced test coverage with the injected event instruction sequence. In block 310, the test instruction sequence, including the injected event instruction, is performed to verify and test functionality of the processor design under test. In embodiments, the responses of the processor to the sequence are analyzed to verify that the processor design is functioning properly.

Figure 4:
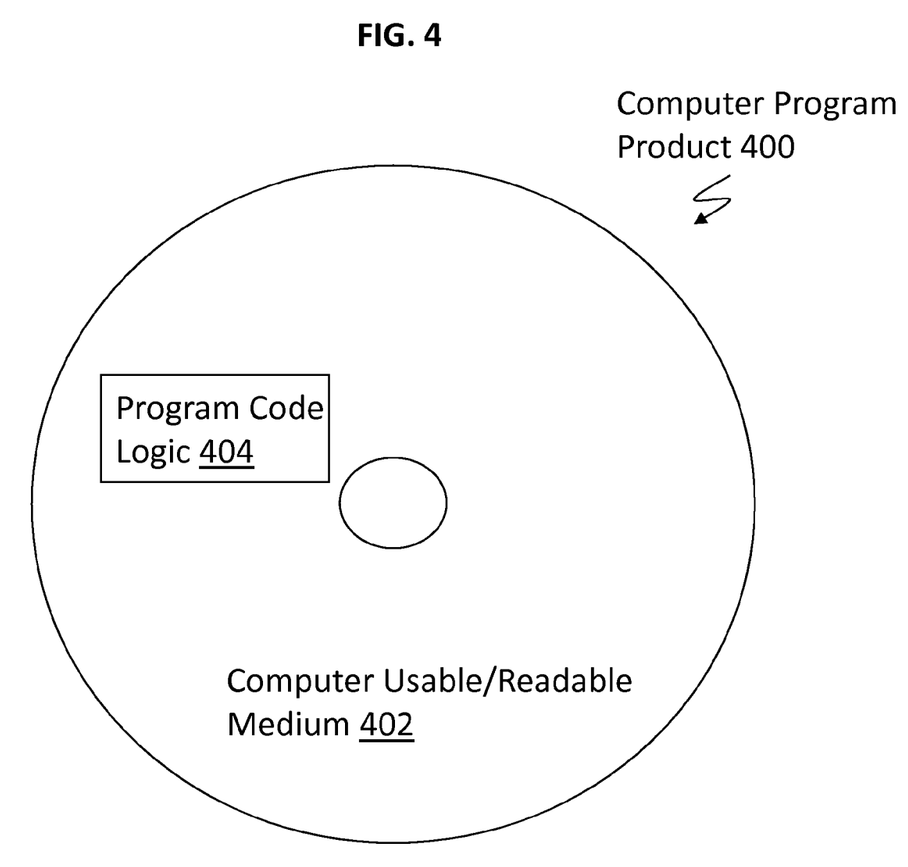
FIG. 4 illustrates an example of a computer program product on a computer readable/usable medium with computer program code logic embodied in tangible media as an article of manufacture

As described above, embodiments can be embodied in the form of computer-implemented processes and apparatuses for practicing those processes. An embodiment may include a computer program product 400 as depicted in FIG. 4 on a computer readable/usable medium 402 with computer program code logic 404 containing instructions embodied in tangible media as an article of manufacture. Exemplary articles of manufacture for computer readable/usable medium 402 may include floppy diskettes, CD-ROMs, hard drives, universal serial bus (USB) flash drives, or any other computer-readable storage medium, wherein, when the computer program code logic 404 is loaded into and executed by a computer, the computer becomes an apparatus for practicing the invention. Embodiments include computer program code logic 404, for example, whether stored in a storage medium, loaded into and/or executed by a computer, or transmitted over some transmission medium, such as over electrical wiring or cabling, through fiber optics, or via electromagnetic radiation, wherein, when the computer program code logic 404 is loaded into and executed by a computer, the computer becomes an apparatus for practicing the invention. When implemented on a general-purpose microprocessor, the computer program code logic 404 segments configure the microprocessor to create specific logic circuits.

In an embodiment, the one or more injected event instruction verifies one or more feature or function that is different than the functions specified for testing by the test template. Thus, the depicted embodiment provides flexibility for altering tests performed on a UUT (e.g., simulated microprocessor). Specifically, the library of test templates remain unchanged as the functionality of the injected event instructions are added to the testing capabilities. In one embodiment, the library of static test templates are used for testing several different device designs, where the only changes to the test instruction sequences to accommodate different designs are provided by the injected event instructions as described above. Accordingly, the test templates have improved portability due to the arrangement described herein.

Embodiments provide a method and system for functional verification testing of processor designs. An existing library of test templates may be used by a test case generator to generate an instruction sequence to test a set of selected mandatory processor functions or properties. Embodiments described herein add testing functionality to instruction sequences from the established library of fixed test templates.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The invention claimed is:

1. A computer program product for functional testing of a processor design, the computer program product comprising:
   a tangible storage medium readable by a processing circuit and storing instructions for execution by the processing circuit for performing a method comprising:
   accessing a test template from a library of test templates, wherein the test template is configured to test a first selected function of the processor;
   inputting the test template to an automated test generation tool executed by a computer;
   generating an instruction sequence based on the test template by the automated test generation tool;
   injecting an event instruction to the instruction sequence during the generating of the instruction sequence by the automated test generation tool, the injecting of the event instruction preserving testing of the first selected function of the processor and the event instruction being configured to test a second selected function of the processor; and
   verifying a function of the processor by analyzing responses of the processor to the instruction sequence.

2. The computer program product of claim 1, wherein the functional testing of the processor design is performed using a simulated design of the processor.

3. The computer program product of claim 1, wherein accessing the test template comprises accessing the test template that includes control statements that restrict the injecting of the event instruction into the instruction sequence.

4. The computer program product of claim 3, wherein the control statements define a first portion of the test template that allow injecting of the event instruction and a second portion of the test template that blocks injecting of the event instruction.

5. The computer program product of claim 1, wherein injecting the event instruction comprises access the event instruction from a repository of event instructions.

6. The computer program product of claim 5, comprising organizing the repository of event instructions by a characteristic of each event instruction and selecting the event instruction based on the characteristic and a control statement in the test template.

7. The computer program product of claim 1, wherein the second selected function is different than the first selected function tested by the test template.

8. A computer implemented method for functional testing of a processor design, the method comprising:
   accessing a test template from a library of test templates, wherein the test template is configured to test a first selected function of the processor;
   inputting the test template to an automated test generation tool executed by a computer;
   generating an instruction sequence based on the test template by the automated test generation tool;
   injecting an event instruction to the instruction sequence during the generating of the instruction sequence by the automated test generation tool, the injecting of the event instruction preserving testing of the first selected function of the processor and the event instruction being configured to test a second selected function of the processor; and verifying a function of the processor by analyzing responses of the processor to the instruction sequence.

9. The method of claim 8, wherein the functional testing of the processor design is performed using a simulated design of the processor.

10. The method of claim 8, wherein accessing the test template comprises accessing the test template that includes control statements that restrict the injecting of the event instruction into the instruction sequence.

11. The method of claim 10, wherein the control statements define a first portion of the test template that allow injecting of the event instruction and a second portion of the test template that blocks injecting of the event instruction.

12. The method of claim 8, wherein injecting the event instruction comprises access the event instruction from a repository of event instructions.

13. The method of claim 12, comprising organizing the repository of event instructions by a characteristic of each event instruction and selecting the event instruction based on the characteristic and a control statement in the test template.

14. The method of claim 8, wherein the second selected function is different than the first selected function tested by the test template.

15. A system for functional testing of a processor design, the system comprising:
 a computer, the system configured to perform a method comprising:
 accessing a test template from a library of test templates, wherein the test template is configured to test a first selected function of the processor;
 inputting the test template to an automated test generation tool executed by a computer;
 generating an instruction sequence based on the test template by the automated test generation tool;
 injecting an event instruction to the instruction sequence during the generating of the instruction sequence by the automated test generation tool, the injecting of the event instruction preserving testing of the first selected function of the processor and the event instruction being configured to test a second selected function of the processor; and
 verifying a function of the processor by analyzing responses of the processor to the instruction sequence.

16. The system of claim 15, wherein the functional testing of the processor design is performed using a simulated design of the processor.

17. The system of claim 15, wherein accessing the test template comprises accessing the test template that includes control statements that restrict the injecting of the event instruction into the instruction sequence.

18. The system of claim 17, wherein the control statements define a first portion of the test template that allow injecting of the event instruction and a second portion of the test template that blocks injecting of the event instruction.

19. The system of claim 15, wherein injecting the event instruction comprises access the event instruction from a repository of event instructions.

20. The system of claim 19, comprising organizing the repository of event instructions by a characteristic of each event instruction and selecting the event instruction based on the characteristic and a control statement in the test template.

* * * * *